US008040124B2

(12) United States Patent
Berrian et al.

(10) Patent No.: US 8,040,124 B2
(45) Date of Patent: Oct. 18, 2011

(54) METHOD AND APPARATUS FOR MONITORING LEAKAGE CURRENT OF A FARADAY CUP

(75) Inventors: Don Berrian, Topsfield, MA (US); Steven Fong, San Jose, CA (US)

(73) Assignee: Advanced Ion Beam Technology, Inc., San Jose, CA (US)

( * ) Notice: Subject to any disclaimer, the term of this patent is extended or adjusted under 35 U.S.C. 154(b) by 423 days.

(21) Appl. No.: 12/388,456

(22) Filed: Feb. 18, 2009

(65) Prior Publication Data
US 2010/0207601 A1 Aug. 19, 2010

(51) Int. Cl.
*G01R 19/00* (2006.01)
(52) U.S. Cl. .................... 324/76.11; 324/71.1; 250/397; 250/492.1
(58) Field of Classification Search ............... 324/76.11; 250/397
See application file for complete search history.

(56) References Cited

U.S. PATENT DOCUMENTS

| 6,437,342 | B2 * | 8/2002 | Johnson | 250/397 |
| 2001/0045514 | A1 * | 11/2001 | Johnson | 250/283 |
| 2009/0243636 | A1 * | 10/2009 | Johansen et al. | 324/713 |

* cited by examiner

*Primary Examiner* — Melissa Koval
*Assistant Examiner* — Benjamin M Baldridge
(74) *Attorney, Agent, or Firm* — Stout, Uxa, Buyan & Mullins, LLP

(57) ABSTRACT

A current branch circuit is electrically coupled with a Faraday cup and an operation amplifier separately. The Faraday cup, the current branch circuit and the operation amplifier are formed as a portion of an ion implanter. When the Faraday cup is electrically coupled with a ground through a conductive structure formed by an ion beam received by the Faraday cup, a current flows from the output of the operation amplifier to the current branch circuit to balance another current flow from the current branch circuit through the Faraday cup to the ground. By dynamically monitoring the voltage of the output of the operation amplifier, current flows through the Faraday cup to the ground and through the resistance of the conductive structure can be dynamically monitored. Accordingly, the difference between the ion current measured by the Faraday cup and the real ion current implanted to the wafer can be dynamically acquired to avoid overdosage of the wafer with the ion beam.

20 Claims, 6 Drawing Sheets

Confirming an electrical connection between a Faraday cup and a measure apparatus, both Faraday cup and measure apparatus is a portion of an ion implanter
310

Measuring a current flowing from the measure apparatus into the Faraday cup
320

FIG. 3

METHOD AND APPARATUS FOR MONITORING LEAKAGE CURRENT OF A FARADAY CUP

BACKGROUND OF THE INVENTION

1. Field of the Invention

The present invention generally relates to an implanter, and more particularly, to a method and an apparatus for monitoring leakage current of a Faraday cup.

2. Description of the Prior Art

Ion implantation processes are widely used in semiconductor manufacture, for example, to implant wafers with various ions having desired energy. Ion implantation processes typically require uniform and consistent amounts of ions to be implanted into a semiconductor wafer.

FIG. 1A is a simplified diagram of a conventional implanter 100. The conventional implanter 100 includes an ion source 110, an analyzer magnet 120, and a Faraday cup 140. In the configuration, a chamber 130 is required to surround the target wafer 20 being implanted and to provide the space through which an ion beam 10 can travel. The ion source 110 is used to generate an ion beam 10 for outputting ions to be implanted into the target wafer 20. The ion beam 10 generated from the ion source 110 is analyzed by the analyzer magnet 120 before the required ions are implanted into the target wafer 20. As usual, the Faraday cup 140 is disposed behind the position of the target wafer 20, and is mounted on the chamber wall of the chamber 130. The chamber wall of the chamber 130 includes an opening 131 corresponding to the position of the Faraday cup 140, such that the ion beam 10 can be received by the Faraday cup 140 if the target wafer 20 is not located. Hence, the current meter 150 electrically coupled with the Faraday cup 140 can measure the ion beam 10 to be implanted into the target wafer 20. Moreover, the chamber wall of the chamber 130 is made of conductive material and coupled with the ground (i.e., electrically grounded). An electrical insulator 135 is disposed between the chamber 130 and the Faraday cup 140 such that the Faraday cup 140 is electrically insulated from the chamber 130 by the electrical insulator 135 whereby all received ion beam current can be measured by the current meter 150.

For a typical conventional ion implanter, a number of measuring and tuning steps must be conducted before ion implantation of wafers. For example, an ion beam current must be measured for precisely adjusting the parameters of the ion implantation, such that the ions practically implanted into the target wafer 20 has the desired energy and distribution. The ion beam current is the quantity of current of the ion beam 10 that impacts the target wafer 20. In the conventional implanter 100, the ion beam current is measured by the Faraday cup 140 before ion implantation of the target wafer 20.

FIG. 1B shows how an ion beam current is measured by the Faraday cup 140. The Faraday cup 140 essentially is a conductor shell for collecting the ion beam 10, and the current meter 150 electrically coupled with the Faraday cup 140 is connected to measure the ion beam current provided by the ion beam 10 collected by the Faraday cup 140. Clearly, with the exception of rare incidents, the ion beam current implanted into the target wafer 20 is equal to the ion beam current received by the Faraday cup 140 as a consequence of it being the same ion beam 10.

FIG. 1C shows the condition of the Faraday cup 140 after repeated measuring processes. Collision between the Faraday cup 140 and ions of the ion beam 10 results in formation of conductive atoms and/or conductive molecules on the surface of the Faraday cup 140 after the chargers of the ions are delivered to the current meter 150. Hence, following repeated measuring processes, conductive structures 30 tend to be formed on the surface of the Faraday cup 140. Moreover, these conductive structures 30 may be distributed randomly, especially after the "vacuum venting" process in which the gas pressure difference typically can induce irregular air flow (i.e., wind) inside of the chamber 130. Thereafter, the conductive structures 30 may electrically couple the Faraday cup 140 with the chamber wall of the chamber 130, such that a portion of the ion beam current received by the Faraday cup 140 will flow through the chamber 130 to the ground. Thereafter, the current measured by the current meter 150 is smaller than the real ion beam current received by the Faraday cup 140, such that the practical ions amount implanted into the target wafer 10 is higher than the excepted ions amount according to the measured ion beam current. As an unavoidable result, the target wafer 20 will be overdosed by the ion beam 10 mentioned above.

In order to prevent the target wafer 20 from being overdosed, these conductive structures 30 should be properly eliminated to avoid any current path formed by it. At least, the resistance between the Faraday cup 140 and the chamber 130 should be measured to properly adjust the measured ion beam current accordingly. As usual, these conductive structures 30 are eliminated or measured when the ion implanter is preventively maintained. Herein, the power of the ion implanter is turned off and the chamber 130 is opened (vacuum venting), such that the tools for eliminating/measuring these conductive structures 30 can be applied on these conductive structures 30 formed on the Faraday cup 140, especially on the surface of the Faraday cup 140 facing the analyzer magnet 120.

However, the cost of the preventive maintenance is high. Moreover, even if the conductive structures 30 is properly eliminated or measured during preventive maintenance, there is still a risk that the distribution of these conductive structures 30 may be changed during the period between preventive maintenances. In other words, the resistance between the Faraday cup 140 and the chamber 130 may be largely unknown between preventive maintenances, as a consequence of the incapability of monitoring real-time for the presence of conductive structures 30 between preventive maintenances. Therefore, the target wafer 20 may still be possibly overdosed by the ion beam 10.

Because of the disadvantages with the prior art such as mentioned above, a need exists to propose a novel method and an apparatus.

SUMMARY OF THE INVENTION

Accordingly, the present invention has been made in order to address such a need as described above, by providing a novel method and apparatus for monitoring leakage current of a Faraday cup.

The present invention provides an apparatus for monitoring leakage current of a Faraday cup, the apparatus including an operation amplifier and a current branch circuit and being built within the ion implanter. An output of the operation amplifier is electrically coupled back with an inverting input of the operation amplifier through a resistor, and the current branch circuit is provided with a first terminal, a second terminal, a first node, and a second node. The first terminal and the second terminal are separately electrically coupled with two voltage sources, each voltage source has an equal magnitude and opposite polarity. The first node is located between the terminals and is electrically coupled with a current output of the Faraday cup, and the second node is located between the first node and the second terminal and electrically coupled with the inverting input of the operation amplifier.

The present invention also provides a method for monitoring leakage current of a Faraday cup by first confirming an electrical coupling between a Faraday cup and a measuring apparatus, wherein both the Faraday cup and the measuring apparatus comprise a portion of an ion implanter. In other words, the measuring apparatus used by the invention can be built within the ion implanter. The method is thus able to measure a current flowing from the measuring apparatus into the Faraday cup without the necessity of opening the chamber and using an external device, such as a multimeter, to measure leakage current of the Faraday cup.

BRIEF DESCRIPTION OF THE DRAWINGS

FIG. 3 presents a flow diagram of a method for monitoring leakage current of a Faraday cup in accordance with an embodiment of the present invention.

DETAILED DESCRIPTION OF THE INVENTION

A detailed description of the present invention is provided in the following embodiments, which are not intended to limit the scope of the present invention and which can be adapted for other applications. While the drawings are presented in detail, it is appreciated that the quantity of the disclosed components may be greater or less than that shown, except for instances expressly restricting the amount of such components.

Figure 1A:
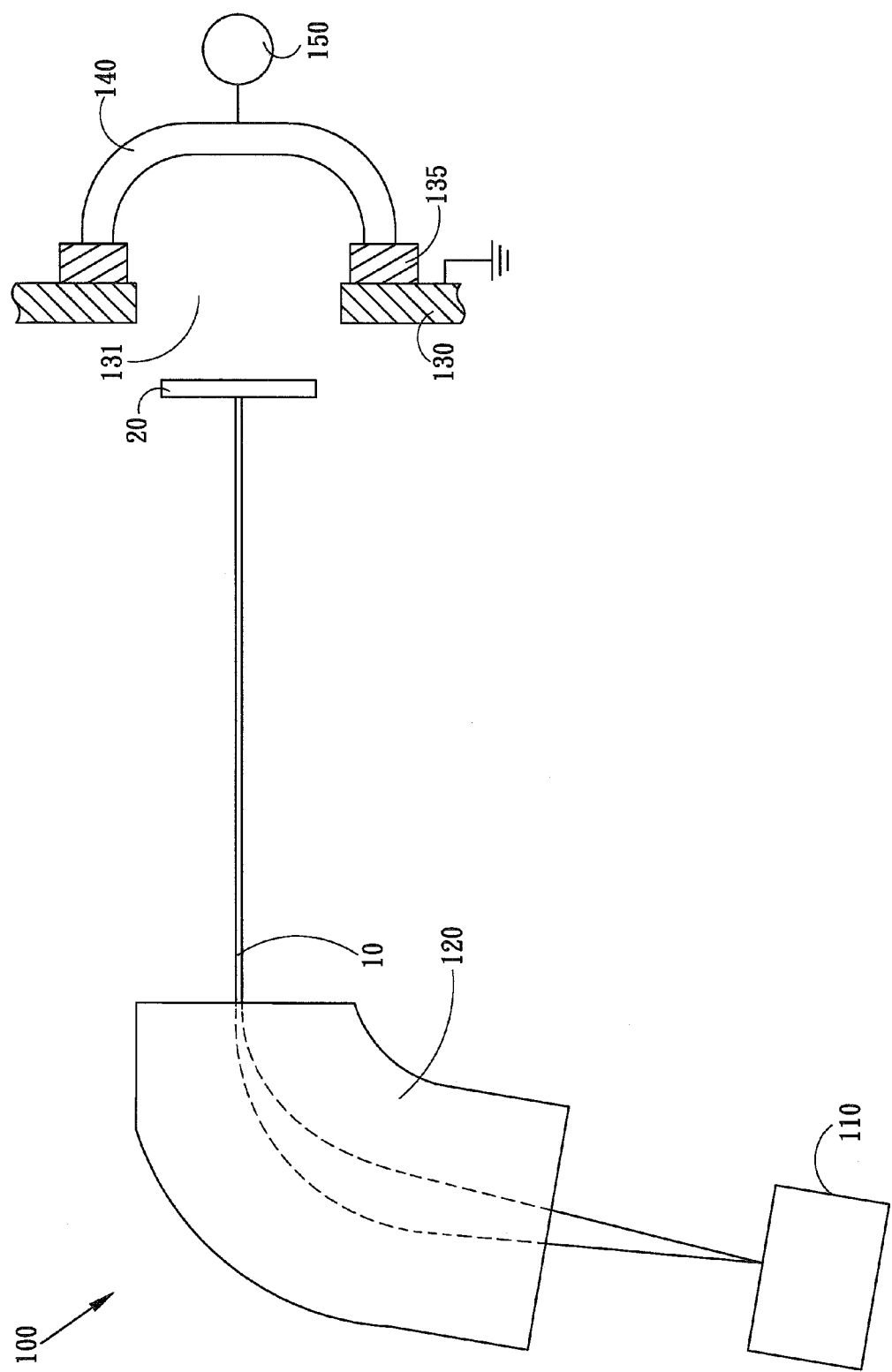
FIG. 1A is a simplified diagram of a conventional implanter.
Figure 1B:
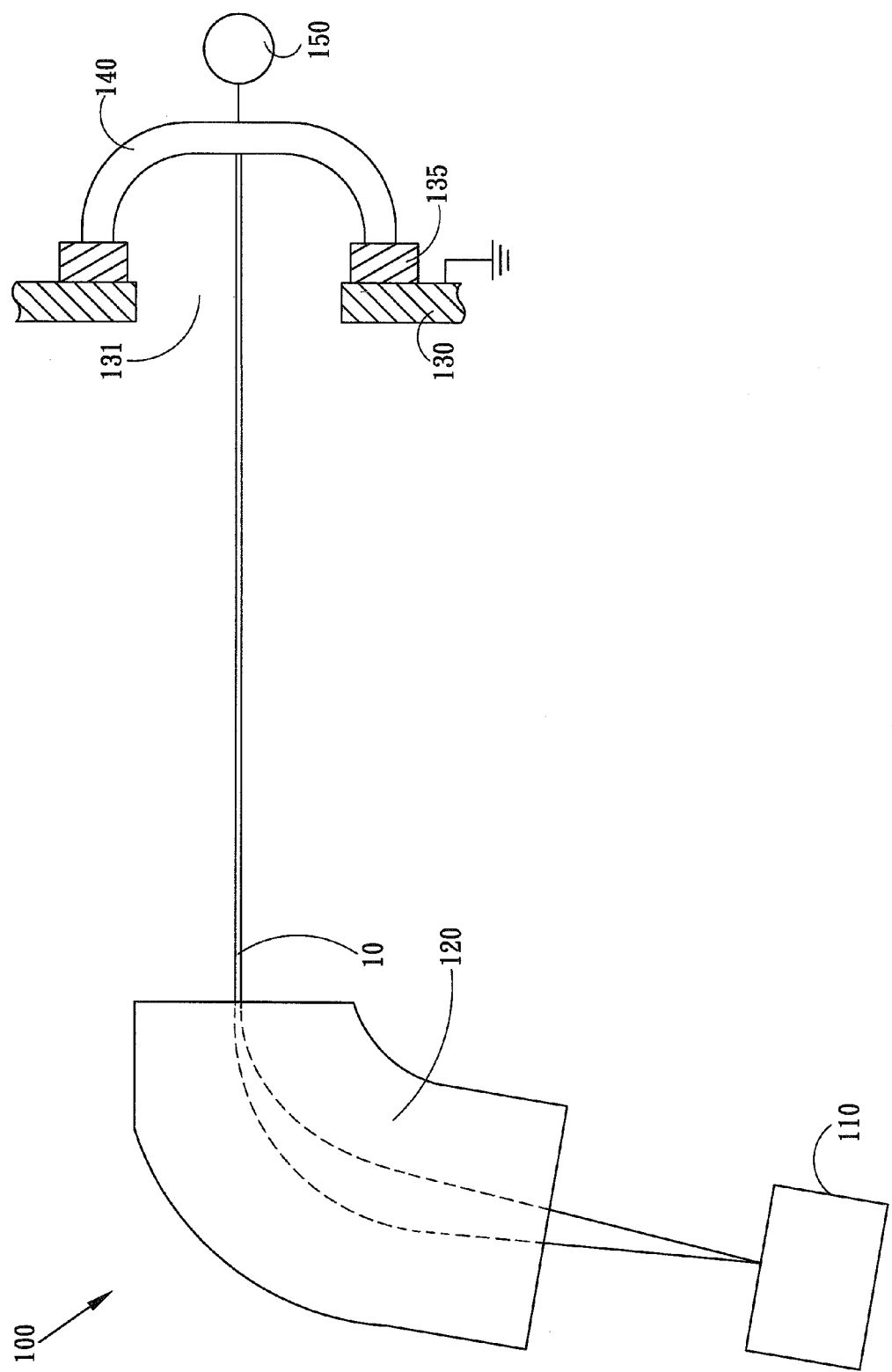
FIG. 1B shows an ion beam current being measured by the Faraday cup.
Figure 1C:
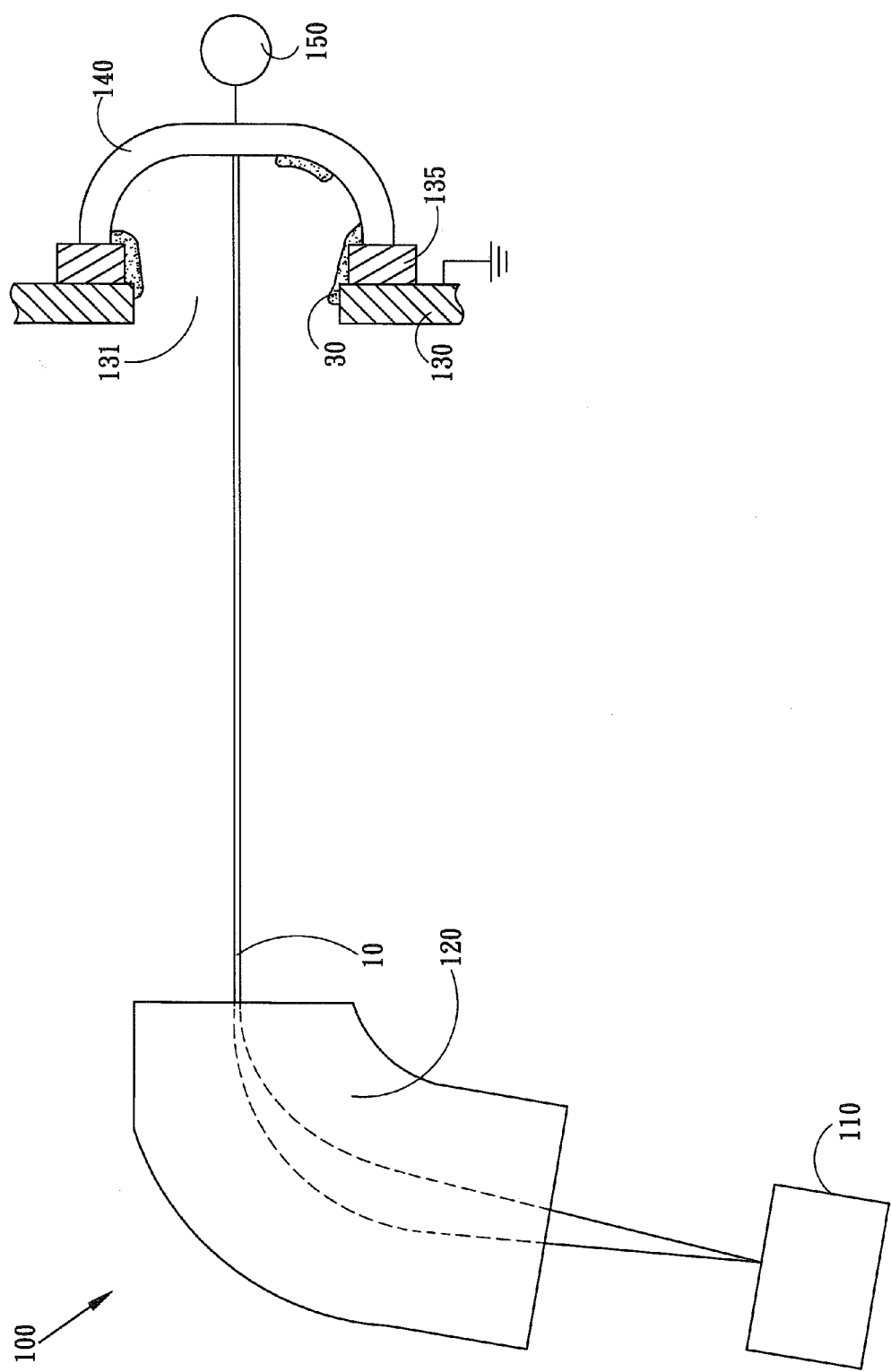
FIG. 1C shows the condition of the Faraday cup after repeated measuring processes.
Figure 2A:
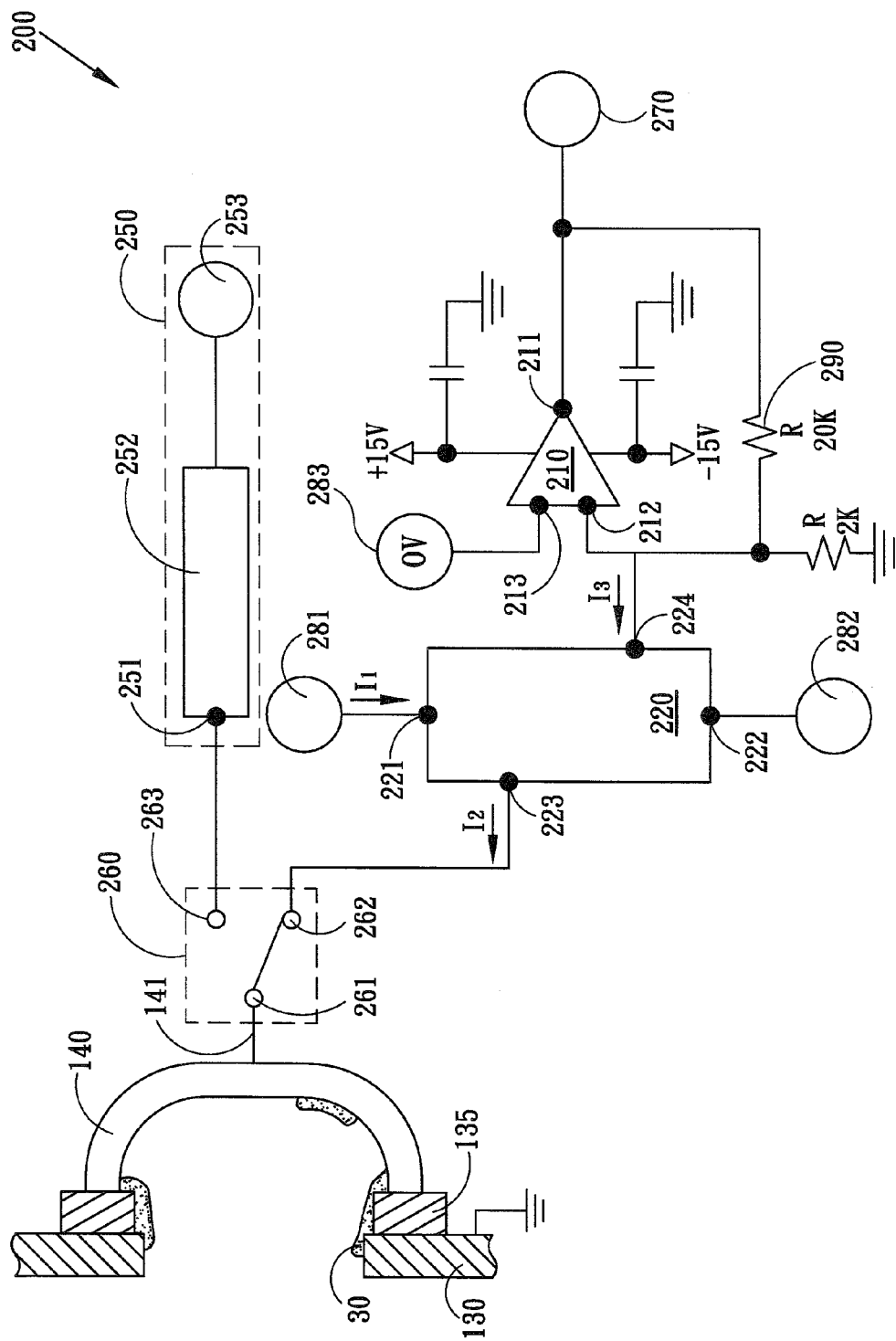
FIG. 2A shows a diagram of an apparatus for monitoring leakage current of a Faraday cup in accordance with an embodiment of the present invention.

FIG. 2A shows a diagram of an apparatus 200 for monitoring leakage current of a Faraday cup 140 in accordance with an embodiment of the present invention. The apparatus 200 for monitoring leakage current of a Faraday cup 140 includes an operation amplifier 210 and a current branch circuit 220. The current branch circuit 220 is selectively electrically coupled with the Faraday cup 140 and is electrically coupled with the operation amplifier 210. According to an aspect of the invention, one or more (e.g., all) of the Faraday cup 140, the current branch circuit 220, and the operation amplifier 210 comprise a portion of the ion implanter, i.e., all are built in the ion implanter. Hence, when the Faraday cup 140 is electrically coupled with the ground through a conductive structure formed by an ion beam received by the Faraday cup 140, and when the current branch circuit 220 is electrically coupled with the Faraday cup 140, a current will flow front the output of the operation amplifier 210 to the current branch circuit 220 to balance another current flow from the current branch circuit 220 through the Faraday cup 140 to the ground. Therefore, by dynamically monitoring the voltage of the output of the operation amplifier 210, which is proportional to the current flow from the operation amplifier 210 to the current branch circuit 220, both the current flows through the Faraday cup 140 to the ground and the conductive structures 30 (i.e., the resistance of the conductive structures 30) can be dynamically monitored. Accordingly, the difference between the ion current measured by Faraday cup 140 and the real ion current implanted into the wafer can be dynamically acquired, so that the ion overdose problem can be effectively improved.

Moreover, according to an embodiment in which the operation amplifier 210 includes an output 211, an inverting input 212, and a non-inverting input 213, the output 211 of the operation amplifier 210 is electrically coupled back to the inverting input 212 of the operation amplifier 210 through a resistor 290. Also, the non-inverting input 213 of the operation amplifier 210 is electrically coupled to a voltage source 283 that provides a zero voltage. Further, the current branch circuit 220 has a first terminal 221, a second terminal 222, a first node 223, and a second node 224. The first terminal 221 and the second terminal 222 are separately electrically coupled with a first voltage source 281 and a second voltage source 282, wherein the first voltage source 281 and the second voltage source 282 have an equal magnitude and opposite polarity. The first node 223 is located between the first terminal 221 and the second terminal 222, and is electrically coupled with a current output 141 of the Faraday cup 140. The second node 224 is located between the first terminal 221 and the second terminal 222 and is electrically coupled with the inverting input 212 of the operation amplifier 210.

To measure the current flows to the Faraday cup 140, the embodiment may include a voltage meter 270 electrically coupled with the output 211 of the operation amplifier 210. The voltage meter 270 measures a voltage of the output 211 of the operation amplifier 210. Owing to the nature of the operation amplifier 210 and the current branch circuit 220, the voltage of the output 211 of the operation amplifier 210 is proportional to a current I2 flowing from the first terminal 221 of the current branch circuit 220 into the current output 141 of the Faraday cup 140. Therefore, by using the voltage meter 270, the current flows from the apparatus 200 through the Faraday cup 140 to the ground can be effectively monitored.

The apparatus 200 for monitoring leakage current of a Faraday cup 140 can also include a switch 260. The switch 260 includes an input 261, a first output 262, and a second output 263. The input 261 is electrically coupled with the current output 141 of the Faraday cup 140, the first output 262 is electrically coupled with the first node 223 of the current branch circuit 220, and the second output 263 is electrically coupled with an input 251 of a current meter 250. The current meter 250 can include a current amplifier 252 and a measuring device 253. The current meter 250 measures an ion beam current received by the Faraday cup 140. By using this switch 260, the Faraday cup 140 can be electrically coupled with both the operation amplifier 210 and the current branch circuit 220, or with the current meter 250. Hence, when an ion beam is projected onto the Faraday cup 140, the current meter 250 can be used to measure the current induced by the received ion beam. In contrast, when there is no ion beam received by the Faraday cup 140, the operation amplifier 210 and the current branch circuit 220 can monitor leakage current of the Faraday cup 140 without confusion.

Clearly, if there is no current path formed by the conductive structure 30, all of the current $I_1$ that flows into the current branch circuit 220 will flow (e.g., totally flow) through the current branch circuit 220, such that no current $I_3$ will flow from the operation amplifier 210 into the current branch circuit 220. Therefore, $I_2$ is equal to zero in which case the output voltage of the output 211 of the operation amplifier 210 will also be zero.

In contrast, when there is a current path formed by the conductive structure 30, the current $I_1$ that flows into the current branch circuit 220 will be divided into two portions. One portion $I_2$ flows through both the Faraday cup 140 and the conductive structure 30 to ground, and the other portion flows through the current branch circuit 220. In such situation, owing to the nature of the current branch circuit 220, some current $I_3$ will flow from the operation amplifier 210 into the current branch circuit 220 to compensate for the portion $I_2$ that flows into the Faraday cup 140. In such a situation, owing to the nature of the operation amplifier 210, the output voltage of the output 211 of the operation amplifier 210 will be non-zero, and the value of the output voltage will be a function of the portion $I_2$ that flows into the Faraday cup 140. According to typical implementations, a higher current $I_2$ will correspond (e.g., directly correspond) to a higher voltage.

Accordingly, it is clear that these embodiments provide an on-line mechanism for dynamically monitoring leakage current of the Faraday cup 140. One or more (e.g., all) of the operation amplifier 210 and the current branch circuit 220 can comprise a portion of the ion implanter, i.e., they can be used to measure the existence of the conductive structure 30 without turning off the power of the ion implanter and opening the chamber 130. Therefore, leakage current of the Faraday cup 140 can be checked anytime, and need not be limited to checkage only during preventive maintenance procedures.

Moreover, owing to the ability to measure leakage current of the Faraday cup 140 anytime, the ion beam current received by the Faraday cup 140 can be adjusted accordingly, immediately. Further, if the damage induced by the leakage current is too serious, a preventive maintenance action can be processed and performed immediately to remove the conductive structures 30. Therefore, by using the invention, wafer loss due to the presence of conductive structure 30 can be effectively attenuated or avoided.

Figure 2B:
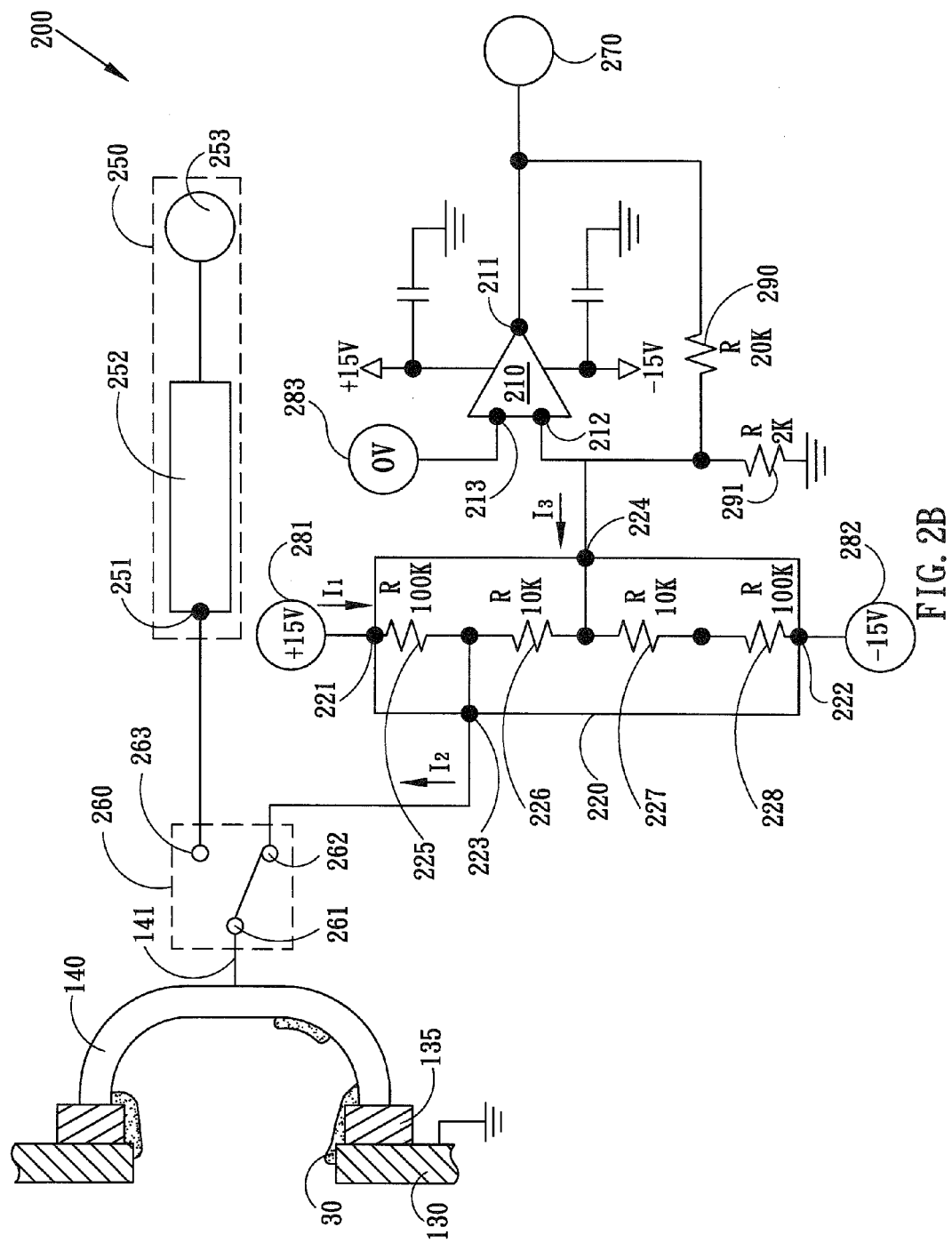
FIG. 2B shows a diagram of an apparatus for monitoring leakage current of a Faraday cup in accordance with another embodiment of the present invention.

FIG. 2B shows a diagram of an apparatus for monitoring leakage current of a Faraday cup 140 in accordance with another embodiment of the present invention. The apparatus 200 includes a current branch circuit 220, an operation amplifier 210, and a fifth resistor 290.

In this embodiment, the current branch circuit 220 includes a first resistor 225, a second resistor 226, a third resistor 227, and a fourth resistor 228. The first resistor 225 is electrically coupled with a first voltage source 281 which provides a positive voltage, such as 15 Volt. The second resistor 226 is electrically coupled with the first resistor 225 and is electrically coupled with a current output 141 of the Faraday cup 140. The third resistor 227 is electrically coupled with the second resistor 226 and the fourth resistor 228. The fourth resistor 228 is also electrically coupled with a second voltage source 282 which provides a negative voltage, such as −15 Volts.

In this embodiment, the operation amplifier 210 includes a first input 213, a second input 212, and an output 211. The first input 213 is electrically coupled with a third voltage source 283 which provides a zero voltage. The second input 212 is electrically coupled with the second resistor 226 and the third resistor 227. The fifth resistor 290 is electrically coupled with the output 211 of the operation amplifier 210 and the second input 212 of the operation amplifier 210. The first input 213 of the operation amplifier 210 is a non-inverting input; the second input 212 of the operation amplifier 210 is an inverting input.

Moreover, as an example, the operation amplifier 210 can be coupled with a positive voltage source and a negative voltage source. Herein, the voltage of the positive voltage source is equal to the voltage of the first voltage source 281, and the voltage of the negative voltage source is equal to the voltage of the second voltage source 282. Also as an example, the voltage of the first voltage source 281 can be opposite to the voltage of the second voltage source 282, the resistance of the first resistor 225 can be equal to the resistance of fourth resistor 228, and the resistance of the second resistor 223 can be equal to the resistance of the third resistor 227. Further, the resistance of the first resistor 225 can be larger than the resistance of the second resistor 226, and the resistance of the fifth resistor 290 can be smaller than the resistance of the first resistor 221 but can be larger than the resistance of the second resistor 226. Moreover, the apparatus 200 can also include a sixth resistor 291 which is electrically coupled with the fifth resistor 290 and a ground voltage respectively.

Clearly, these embodiments are similar to the previous embodiments, with differences being the details of both the current branch circuit 220 and the operation amplifier 210, and the existence of the fifth resistor 290.

Furthermore, the apparatus 200 can include a voltage meter 270 for measuring the voltage of the output 211 of the operation amplifier 210 and can include a switch 260 having an input 261, a first output 262 and a second output 263. As embodied herein, the input 261 is electrically coupled with the current output 141 of the Faraday cup 140, the first output 262 is electrically coupled with the first node 223 of the current branch circuit 220, and the second output 263 is electrically coupled with an input 251 of a current meter 250. The current meter 250, which can include a current amplifier 252 and a measuring device 253, measures an ion beam current received by the Faraday cup 140.

FIG. 3 shows a flow diagram of a method for monitoring leakage current of a Faraday cup in accordance with an embodiment of the present invention. The method is depicted to include two essential steps exemplified by block 310 and block 320. Firstly, as shown in block 310, an electrical coupling is confirmed between a Faraday cup and a measuring apparatus, wherein both the Faraday cup and the measuring apparatus comprise a portion of an ion implanter. Then, as shown in block 320, the method measures a current flowing from the measuring apparatus into the Faraday cup when there is no ion beam being received by the Faraday cup.

Clearly, the main characteristic of the embodiment is that the measuring apparatus is or comprises a portion of the ion implanter, e.g., is built into the ion implanter. Hence, in comparison with prior art devices that require turning-off of power and opening of the chamber for measuring leakage current of the Faraday cup, the method can expeditiously measure leakage current of the Faraday cup when the ion implanter is ready to work or is working.

Furthermore, the proposed method is not intended to be limited to the disclosed details of the measuring apparatus. According to an aspect of the invention, the key is the method of measuring (e.g., when to measure), and not necessarily the details used to perform the measuring.

However, as an example, the Faraday cup can be a portion of a wall of a chamber and the measuring apparatus can be located outside of the chamber. The measuring apparatus can include an operation amplifier and a current branch circuit. In this implementation, the operation amplifier includes an output, an inverting input, and a non-inverting input, the output of the operation amplifier is electrically coupled back to the inverting input of the operation amplifier through a resistor, and the non-inverting input of the operation amplifier is electrically coupled to a voltage source that provides a zero voltage. As embodied herein, the current branch circuit has a first terminal, a second terminal, a first node, and a second node. The first terminal and the second terminal are separately electrically coupled with a first voltage source and a second voltage source, wherein the first voltage source and the second voltage source have an equal magnitude and opposite polarity. The first node is located between the first terminal and the second terminal. The first node is electrically coupled with a current output of the Faraday cup. The second node is located between the first terminal and the second terminal. The second node is electrically coupled with the inverting input of the operation amplifier.

Moreover, as an example, the method can include the step of electrically coupling the measuring apparatus with an electric source such that an additional current I1 flows from the electric source into the measuring apparatus, wherein the electric source can be a voltage source or a current source. Therefore, owing to the measuring apparatus being electrically coupled with the Faraday cup, if there is any leakage current on the Faraday cup, at least a portion of the current the additional current I1 becomes the current I2 that flows from the measuring apparatus to the Faraday cup.

Further, as an example, the method can include the step of coupling the current output of the Faraday cup with the first node of the current branch circuit and decoupling the current output of the Faraday cup with a current meter that measures an ion beam current received by the Faraday cup. Hence, when there is no ion beam received by the Faraday cup, the method can measure the current between the measuring apparatus and the Faraday cup without risk of current flowing to the current meter and any circuitry connected to the current meter. In other words, only current induced by leakage current of the Faraday cup is measured.

Moreover, as an example, the method can include the step of measuring a voltage of an output of the operation amplifier, wherein the voltage of the output of the operation amplifier is proportional to the current I2 flowing from the apparatus into the current output of the Faraday cup. Therefore, by simple on-line monitoring of the voltage of the output of the operation amplifier, leakage current of the Faraday cup can be dynamically monitored.

Although specific embodiments have been illustrated and described, it will be appreciated by those skilled in the art that various modifications may be made without departing from the scope of the present invention, which is intended to be limited solely by the appended claims.

What is claimed is:

1. An apparatus for monitoring leakage current of a Faraday cup in an ion implanter, comprising:
    an operation amplifier, wherein an output of said operation amplifier is electrically coupled with an inverting input of said operation amplifier through a resistor; and
    a current branch circuit, wherein said current branch circuit is selectively coupled to the Faraday cup, and wherein the current branch circuit has a first terminal, a second terminal, a first node and a second node, said first terminal and said second terminal being separately electrically coupled with two voltage sources, each voltage source having an equal magnitude and opposite polarity, said first node being located between and electrically coupled to said first and second terminals, and electrically coupled with a current output of said Faraday cup, and said second node being located between and electrically coupled to said first node and said second terminal and electrically coupled with said inverting input of said operation amplifier,
    wherein the Faraday cup and the operational amplifier and current branch circuit comprise a portion of the ion implanter.

2. The apparatus as set forth in claim 1, further comprising a voltage meter that measures a voltage of said output of said operation amplifier.

3. The apparatus as set forth in claim 2, wherein said voltage of said output of said operation amplifier is proportional to a current flowing from said first node of said current branch circuit into said current output of said Faraday cup.

4. The apparatus as set forth in claim 1, further comprising a switch having an input, a first output and a second output, said input being electrically coupled with said current output of said Faraday cup, wherein said first output is electrically coupled with said first node of said current branch circuit, and wherein said second output is coupled with an input of a current meter capable of measuring an ion beam current received by said Faraday cup.

5. The apparatus as set forth in claim 1, wherein a non-inverting input of said operation amplifier is electrically coupled to a voltage source providing a zero voltage.

6. A method for monitoring leakage current of a Faraday cup in an ion implanter, comprising:
    confirming a selective electrical coupling between a Faraday cup and a measuring apparatus, wherein both said Faraday cup and said measuring apparatus comprise a portion of the ion implanter; and
    measuring a current flowing from said measuring apparatus into said Faraday cup, when there is no ion beam received by said Faraday cup, wherein said measuring apparatus comprises an operation amplifier, wherein an output of said operation amplifier is electrically coupled with an inverting input of said operation amplifier through a resistor, and a current branch circuit having a first terminal and a second terminal coupled to two separate voltage sources, each voltage source having an equal magnitude and opposite polarity.

7. The method as set forth in claim 6, wherein said Faraday cup is a portion of a wall of a chamber, and wherein said measuring apparatus is located outside of said chamber.

8. The method as set forth in claim 6, further comprising electrically coupling said measuring apparatus with an electric source, such that an additional current flows from said electric source into said measuring apparatus and at least a portion of said additional current can become said current, and wherein said electric source is chosen from a group consisting essentially of a voltage source and a current source.

9. The method as set forth in claim 6, wherein said current branch circuit further comprises:
    a first node and a second node, said first node being located between said terminals and electrically coupled with a current output of said Faraday cup, and said second node being located between said first node and said second terminal and electrically coupled with said inverting input of said operation amplifier.

10. The method as set forth in claim 9, further comprising coupling said current output of said Faraday cup with said first node of said current branch circuit, and decoupling said current output of said Faraday cup with a current meter that measures an ion beam current received by said Faraday cup.

11. The method as set forth in claim 9, further comprising measuring a voltage of an output of said operation amplifier, wherein said voltage of said output of said operation amplifier is proportional to a current flowing from said apparatus into said current output of said Faraday cup.

12. An apparatus for monitoring leakage current of a Faraday cup in an ion implanter, comprising:
    (a) a current branch circuit, including:

(i) a first resistor, a first terminal of said first resistor being electrically coupled with a first voltage source;

(ii) a second resistor, a first terminal of said second resistor being electrically coupled with a second terminal of said first resistor, said first terminal of said second resistor selectively electrically coupling with a current output of said Faraday cup;

(iii) a third resistor, a first terminal of said third resistor being electrically coupled with a second terminal of said second resistor; and (iv) a fourth resistor, a first terminal of said fourth resistor being electrically coupled with a second terminal of said third resistor and a second terminal of said fourth resistor being electrically coupled with a second voltage source;

(b) an operation amplifier, including:

(i) a first input, said first input being electrically coupled with a third voltage source, (ii) a second input, said second input being electrically coupled with said second terminal of said second resistor; and (iii) an output; and (c) a fifth resistor, a first terminal of said fifth resistor being electrically coupled with said output of said operation amplifier, and a second terminal of said fifth resistor being electrically coupled with said second input of said operation amplifier, wherein the Faraday cup and the operational amplifier and current branch circuit comprise a portion of the ion implanter.

13. The apparatus as set forth in claim 12, further comprising a voltage meter for measuring the voltage of said output of said operation amplifier.

14. The apparatus as set forth in claim 12, further comprising a sixth resistor having a first terminal electrically coupled with said second terminal of said fifth resistor and a second terminal electrically coupled with a ground voltage.

15. The apparatus as set forth in claim 12, wherein a voltage of said first voltage source is opposite to a voltage of said second voltage source, wherein a resistance of said first resistor is equal to a resistance of said fourth resistor, wherein a resistance of said second resistor is equal to a resistance of said third resistor, and wherein said resistance of said first resistor is larger than said resistance of said second resistor.

16. The apparatus as set forth in claim 12, wherein said resistance of said fifth resistor is smaller than said resistance of said first resistor but is larger than said resistance of said second resistor.

17. The apparatus as set forth in claim 12, wherein a voltage of said third voltage source is zero.

18. The apparatus as set forth in claim 12, wherein said first input of said operation amplifier is a non-inverting input, and wherein said second input of said operation amplifier is an inverting input.

19. The apparatus as set forth in claim 12, further comprising a switch having an input, a first output and a second output, said input being electrically coupled with said current output of said Faraday cup, said first output being electrically coupled with said first terminal of said second resistor, and said second output being electrically coupled with an input of a current meter capable of measuring an ion beam current received by said Faraday cup.

20. The apparatus as set forth in claim 19, said first input of said operation amplifier being electrically coupled with an output of said current amplifier.

* * * * *